United States Patent [19]

Brandt et al.

[11] 4,240,099
[45] Dec. 16, 1980

[54] SEMICONDUCTOR DEVICE PLASTIC JACKET HAVING FIRST AND SECOND ANNULAR SHEET METAL STRIPS WITH CORRUGATED OUTER EDGES EMBEDDED IN SAID PLASTIC JACKET

[75] Inventors: Jürgen Brandt; Ludwig Herold; Wolfgang Pikorz; Alois Sonntag, all of Warstein, Fed. Rep. of Germany

[73] Assignee: Licentia Patent-Verwaltungs-G.m.b.H., Frankfurt am Main, Fed. Rep. of Germany

[21] Appl. No.: 19,607

[22] Filed: Mar. 12, 1979

[30] Foreign Application Priority Data

Mar. 10, 1978 [DE] Fed. Rep. of Germany ....... 2810416

[51] Int. Cl.³ .................... H01L 23/42; H01L 23/44; H01L 23/46
[52] U.S. Cl. .......................... 357/79; 357/74; 357/81; 174/52 S; 174/52 H
[58] Field of Search .............. 357/74, 76, 79, 81; 174/52 S, 52 H, 50.61

[56] References Cited

U.S. PATENT DOCUMENTS

| 3,437,887 | 4/1969 | Nowalk et al. | 357/72 |
| 3,443,168 | 5/1969 | Camp | 357/72 |
| 3,559,001 | 1/1971 | Cooper et al. | 357/79 |
| 3,721,867 | 3/1973 | Schierz | 357/72 |
| 3,831,067 | 8/1974 | Wislocky et al. | 357/72 |
| 3,986,201 | 10/1976 | Herold et al. | 357/72 |
| 4,008,486 | 2/1977 | Byczkowski | 357/81 |

Primary Examiner—Andrew J. James
Attorney, Agent, or Firm—Spencer & Kaye

[57] ABSTRACT

A high performance, wafer-shaped semiconductor device of the type including a wafer-shaped semiconductor element, a pair of electrodes located on the surfaces of the element, a pair of cylindrical metal bodies contacting the electrodes, an insulating ring enclosing and centering the metal bodies and the semiconductor element and a plastic jacket surrounding the insulating ring for tightly encasing the semiconductor device. In addition, there is provided a pair of annular sheet metal strips each of which has an inner edge region fastened to one of the cylindrical metal bodies and a corrugated chemically roughened outer edge region which is embedded in the plastic jacket. A powder coating is applied to the chemically roughened outer edge region for the purpose of providing a pressure and oil-tight housing for the semiconductor device.

5 Claims, 1 Drawing Figure

U.S. Patent    Dec. 16, 1980    4,240,099
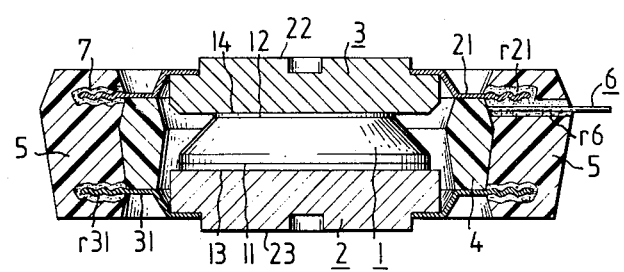

SEMICONDUCTOR DEVICE PLASTIC JACKET HAVING FIRST AND SECOND ANNULAR SHEET METAL STRIPS WITH CORRUGATED OUTER EDGES EMBEDDED IN SAID PLASTIC JACKET

BACKGROUND OF THE INVENTION

The present invention relates to a high performance wafer-shaped semiconductor device having a tightly encasing plastic jacket. More specifically, it is an improvement over the semiconductor device disclosed in U.S. Pat. No. 3,986,201 granted to Herold et al on Oct. 12th, 1976.

In this prior art device, a wafer-shaped semiconductor element is provided with major electrodes on two major surfaces. A pair of heat dissipating cylindrical metal bodies are attached to respective ones of the major electrodes and an insulating ring encloses and centers the metal bodies and the semiconductor element. The insulating ring is held between two annular strips of sheet metal having inner edge regions that are fastened to the outer surfaces of the two metal bodies and outer edge regions that are embedded in a plastic jacket encasing the wafer-shaped semiconductor element, the jacket having been produced by casting or molding under pressure. However, it has been found very difficult to provide a plastic jacket housing as part of a wafer-shaped semiconductor device which will remain consistently tight over a broad temperature range of $-40°$ C. to $+150°$ C. and also after alternating thermal stresses. Alternating thermal stresses produce mechanical tensions in a device of the above-described type due to the different coefficients of thermal expansion of the metal bodies contacting the semiconductor element and the plastic used as a housing in the device. Such mechanical tensions lead to the formation of cracks in the plastic or cause the plastic to become detached from the metal strip embedded in the plastic. Reliable adhesion of the plastic to the metal parts is not assured, particularly if molding resins are used to encase the semiconductor element.

This occurs because molding resins, in order to be easily removed from the mold, contain additives in the form of mold release agents; i.e. substances which will facilitate removal from the mold. These mold release agents may prevent adhesion between the pressed plastic mass and the metallic housing portions to be encased thereby making it impossible to obtain a housing which is consistently tight.

It is an object of the present invention to provide a semiconductor device of the above-described type which permits the realization of a reliable bond between the metallic housing portions and the pressed plastic mass so that the resulting housing portecting the semiconductor element is pressure-tight as well as oil-tight.

SUMMARY OF THE INVENTION

This is accomplished by the present invention wherein the outer edge regions of the annular sheet metal strips are corrugated and the surfaces thereof are chemically roughened and provided with a coating of powdered plastic. The powder coating forms, in an advantageous manner, an effective primer between the annular sheet metal strips and the plastic jacket encasing the semiconductor device.

According to a further embodiment of the invention, the plastic powder coating consists of a powdered lacquer based on epoxy resins, polyester resins or polyurethane resins. These polymer systems exhibit good adhesion on metallic substrates.

Furthermore, sintered plastic powder coatings as well as electrostatic plastic powder coating can be used in connection with the present invention. These coatings are particularly suitable because they are easy to apply selectively to a metallic substrate with the aid of a mask made, for example, of Teflon. In a preferred embodiment of the invention, the plastic powder coating has a thickness of $40\mu$ to $100\mu$.

BRIEF DESCRIPTION OF THE DRAWING

The FIGURE is a cross-sectional view of a thyristor type semiconductor device according to the invention.

DESCRIPTION OF THE PREFERRED EMBODIMENTS

Referring to the drawing, there is shown a wafer-shaped semiconductor device designed to operate as a thyristor and having main electrodes 13 and 14 attached to the two major surfaces 11 and 12 of a wafer-shaped semiconductor element 1. A control electrode (not shown) is also attached to the major surface 12. Two cylindrical solid-copper metal bodies 2 and 3 and an insulating ring 4 are also provided.

The thyristor element 1 is disposed between the two metal bodies 2 and 3, main electrode 13 being in areal contact with the metal body 2 and main electrode 14 being in areal contact with the metal body 3. The thyristor element 1 and the two metal bodies 2, 3 are held within the insulating ring 4 in a centered position.

The insulating ring 4 is made of plastic, preferably a mineral or glass fiber reinforced epoxy resin, whose heat distortion temperature after curing is so high that the insulating ring 4 will not be deformed at the processing temperature required for encasing the device.

The copper metal bodies 2 and 3 serve as current taps. Annular sheet metal copper strips 21 and 31 are hard-soldered to respective peripheral outer surfaces of cylindrical metal bodies 3 and 2. The metal strips 21 and 31 protrude radially above the insulating ring 4 and are provided with corrugated edge regions r21 and r31 which are embedded in a plastic jacket 5. The plastic jacket 5 acts as a casing for the thyristor device and has dimensions that are so selected that the free frontal faces of the jacket 5 protrude from both sides in order to enable these frontal faces to be contacted. Thermosetting resins, such as for example epoxy resins, can be used as the material for jacket 5. In the production of such molded items, injection pressing (transfer pressing) has been found to be a suitable processing method.

The plastic jacket 5 may be fabricated by placing the thyristor device in a suitably dimensioned mold and the molding mass, which has been plasticized in a pressure chamber under heat and pressure, pressed by means of a stamp through channels into the cavity existing in the previously closed mold which is under pressure. During cure of the plastic, pressure is maintained on the areas of the metal strips 21 and 31 resting on the insulating ring 4. Because of this pressure and due to the presence of the insulating ring 4, the plastically flowing resin cannot reach the semiconductor element 1 disposed between the metal bodies 2 and 3. After cure of the resin, the mold halves can be separated and the encased device removed from the mold.

In addition to the type of pressing mass employed, a reliable bond between the mass used for the jacket 5 and the metal strips 21 and 31 embedded therein is also of importance in achieving a permanently tight housing structure. Molding resins do not provide favorable conditions in this respect since, in order to provide easy removal of the pressed object from the mold, additives in the form of mold release agents are required to prevent adhesion of the plastic to the metal parts of the mold.

A permanently tight housing for the semiconductor device can be obtained using the duroplastic pressed masses described above by providing a powder coating 7 on the edge regions r21 and r31 of the metal strips 21 and 31, respectively. Particularly suitable coating materials are powdered lacquers based on epoxy resins, polyester resins or polyurethane resins. In order to improve the adhesion of this powder coating on metal, the housing parts to be coated are first chemically roughened. Tube 6, through which a connecting lead of the control electrode is passed, is also provided with a powder coating r6 in the areas where it is embedded in the plastic jacket 5.

More specifically, powdered lacquers based on epoxy resins, as being used, may have different compositions which are characterized by two possible cross-link types of epoxy groups such as for hardening cure with catalytic doses or with stoichiometric additivities. Direct linkage of the epoxy resin molecules with one another is a distinguished feature of the above mentioned first type forming cross-links with groups of ether performed with ionizing and polymerizing catalytic agents, for instance strong alcalines and metal salts. Cross-links of the above mentioned second type are performed for hardening cure by accumulation of compounds with active hydrogen atoms to the epoxy groups.

It has been shown that powdered lacquers based on polyester resins have the greatest importance while the outlook for lacquers based on polyurethane resins seems restricted. Powdered lacquers based on polyester resins (with carboxyl and hydroxyl groups) are characterized as cross-links with epoxy and amino resins and with polyglycidyl compounds, in particular anhydrides, lacquers of that kind being estimated most suitable as a powder coating material.

In order to provide a powder coating 7 on the roughened edge regions of the metal strips 21 and 31, two equal cylindrical cups with inside and outside diameters matching the diameters of the insulating ring 4, both out of Teflon, may be used as a mask for spraying a sintered or an electrostatic coating material. This can be done by setting the cups one against another on the rims of their openings with one housing part, that is each cylindrical metal body 2 and 3 having first (second) annular sheet metal strip 21 (31 respectively) fastened on its outer surface, inserted between the masking cups though as only the edge region r21 (r31) protrude radially above the cylindrical surface of the two cups. Than, for applying a sintered powder coating on the edge region, the masking cups with the housing part inserted between the cups are heated to more than the melting temperature of the powder coating material and are brought in a fluidizing sintering bed to be exposed therein. After exposition during a time interval of 1 minute the powder coating has been formed on the roughened edge region r21 (r31), the masking cups with the housing part can be taken out of the sintering bed and then is left to cool to room temperature.

Electrostatical spraying can be done with the aid of a spray pistol, kept at high voltage, and using a ground lead which passes through the bottom of one of the masking cups to contact the cylindrical metal body. The unmasked edge region r21 (r31) of the unheated housing part is now electrostatically sprayed and coated with the powder material. After spraying, masking cups are removed and finally the housing part is heated to a temperature of about 200° Celsius. The temperature is kept constant for about 5 minutes. Thereafter the housing part is left to cool to room temperature.

Prior to powder coating, as foregoing discribed, the edge regions r21 and r31 of the annular sheet metal strips 21 and 31, respectively, are roughened in an etching solution containing 150 gramms of $(NH_4)_2S_2O_8$ and 5 gramms of HCl per 1000 $cm^3$ volume (Liter) at room temperature during a time interval of 2 until 5 minutes.

A suitable material for the plastic jacket 5, as well as for the insulating ring 4 are epoxy resins containing a large amount of mineral fillers whose coefficient of thermal expansion comes as close as possible to that of the metal bodies 2 and 3 as well as metal strips 21 and 31. In this way, mechanical tensions are avoided between the plastic parts and the metal parts during alternating thermal stresses.

Since it is possible that the coefficient of thermal expansion of the plastics may change considerably with changes in temperature, it is of advantage to use molded masses whose softening temperature after complete curing is clearly higher than the stress temperature since the coefficient of thermal expansion rises considerably in the range of the softening temperature.

It has been found that wafer-shaped semiconductor devices which are provided with a powder coating according to the invention exhibit a tightness which remains stable despite changes in the thermal load. This provides better protection against humidity for the semiconductor device and it can be operated even in an environment of high relative humidity. Since the penetration of oil into the interior of the housing is also dependably prevented under thermal stresses, such devices can even be operated in an oil bath.

Experiments have shown that such devices are completely tight after more than fifty changes of thermal load at temperatures between $-40°$ C. and $+140°$ C.

It will be understood that the above description of the present invention is susceptible to various modifications, changes and adaptations, and the same are intended to be comprehended within the meaning and range of equivalents of the appended claims.

What is claimed is:

1. A high performance wafer-shaped semiconductor device including a wafer-shaped semiconductor element having first and second opposed major surfaces; first and second electrodes on the first and second major surfaces respectively of said semiconductor element; first and second cylindrical metal bodies each having an inner surface contacting said first and second electrodes, respectively, and an outer surface, said metal bodies serving as means for making electrical connections to said semiconductor element and for dissipating heat; an insulating ring enclosing and centering said metal bodies and said semiconductor element; and a plastic jacket surrounding said insulating ring for tightly encasing said semiconductor element wherein the improvement comprises first and second annular sheet metal strips each having an inner edge region fastened to an outer surface of a corresponding cylindrical metal body and a corrugated chemically roughened outer edge region embedded in said plastic jacket; and a powder coating on said chemically roughened outer edge regions, whereby a reliable bond is obtained between said plastic jacket and said metal strips to obtain a pressure and oil-tight housing for said semiconductor device.

2. A wafer-shaped semiconductor device as defined by claim 1 wherein said powder coating comprises a powdered lacquer based on a resin selected from the group consisting of epoxy, polyester and polyurethane.

3. A wafer-shaped semiconductor device as defined by claim 1 wherein the edge regions of said first and second annular sheet metal strips are provided with an electrostatic coating of powder.

4. A wafer-shaped semiconductor as defined by claims 1, 2 or 3 wherein said plastic powder coating has a thickness of $40\mu$ to $100\mu$.

5. A wafer-shaped semiconductor device wherein the outer surfaces of said cylindrical metal bodies to which the inner edges of said sheet metal strips are secured and located on the outer peripheries of said bodies.

* * * * *